(12) United States Patent
Sowlati

(10) Patent No.: US 6,556,084 B2
(45) Date of Patent: Apr. 29, 2003

(54) LINEARIZED CLASS C AMPLIFIER WITH DYNAMIC BIASING

(75) Inventor: Tirdad Sowlati, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 158 days.

(21) Appl. No.: 09/739,500

(22) Filed: Dec. 18, 2000

(65) Prior Publication Data

US 2002/0075076 A1 Jun. 20, 2002

(51) Int. Cl.[7] .............................. H03F 3/04; H03F 3/26
(52) U.S. Cl. ....................... 330/296; 330/267; 330/273
(58) Field of Search ................................ 330/267, 273, 330/296

(56) References Cited

U.S. PATENT DOCUMENTS

| | | | | |
|---|---|---|---|---|
| 4,924,191 A | * | 5/1990 | Erb et al. .................... | 330/130 |
| 5,229,721 A | * | 7/1993 | Stade .......................... | 330/265 |
| 6,025,754 A | * | 2/2000 | Czora .......................... | 330/296 |

OTHER PUBLICATIONS

US 000082, U.S. Ser. No. 09/536,946, filed: Mar. 28, 2000.

* cited by examiner

*Primary Examiner*—Patricia Nguyen
(74) *Attorney, Agent, or Firm*—Aaron Waxler

(57) ABSTRACT

A power amplifier circuit includes an amplifying transistor and a dc bias circuit for biasing the amplifying transistor to obtain a conduction angle of less than about 180°. The dc bias circuit includes a dynamic biasing circuit for decreasing the dc bias signal provided to the amplifying transistor as the input signal to the power amplifier circuit increases. This configuration permits the amplifier circuit to operate as a linearized Class C amplifier, having a substantially linear input-output relationship similar to that of a Class B amplifier, but with increased operating efficiency.

7 Claims, 1 Drawing Sheet

LINEARIZED CLASS C AMPLIFIER WITH DYNAMIC BIASING

BACKGROUND OF THE INVENTION

The invention is in the field of transistor amplifier circuits, and relates more particularly to a Class C power amplifier circuit having a dynamic biasing circuit for linearizing the amplifier.

Amplifiers of this general type are frequently used in such applications as high-frequency RF amplifiers, such as those used in wireless communications devices. In order to obtain the desired linear input-output characteristic, the output stage is typically operated in Class B or Class AB. Although it would be desirable to operate the output stage in Class C in order to benefit from the higher efficiency obtainable in this mode, this has not heretofore been possible when a linear amplifier characteristic is also desired, due to the inherent nonlinearity of the Class C mode.

A technique for boosting amplifier bias to achieve optimum maximum power output level and reduced power dissipation at low power levels in a Class B or Class AB amplifier circuit is disclosed in U.S. patent application Ser. No. 09/536,946, filed Mar. 28, 2000, by Sifen Luo and the present inventor. That invention is directed to boosting a bias signal to maintain linear operation in Class B or Class AB, but does not enable linear operation in the more-efficient Class C mode of operation.

Accordingly, it would be desirable to have a power amplifier circuit which offers the advantage of higher efficiency inherent in Class C operation, while at the same time providing a substantially linear input-output relationship similar to that of a Class B amplifier.

SUMMARY OF THE INVENTION

It is therefore an object of the present invention to provide a power amplifier circuit which provides the advantage of higher efficiency inherent in Class C operation, while at the same time providing a substantially linear input-output relationship similar to that of a Class B amplifier.

In accordance with the invention, this object is achieved by a new power amplifier circuit for amplifying an input signal and having a conduction angle of less than about 180°. The circuit includes an amplifying transistor and a dc bias circuit for biasing the amplifying transistor to obtain the desired conduction angle. The dc bias circuit includes a dynamic biasing circuit for decreasing a dc bias signal provided to the amplifying transistor as the input signal to the power amplifier circuit increases.

In a preferred embodiment of the invention, the power amplifier circuit is a linearized Class C amplifier circuit.

In a further preferred embodiment of the invention, the amount of decrease in the dc bias signal is proportional to the amount of increase in the amplitude of the input signal. Assuming a piecewise linear transistor characteristic for simplicity, this proportionality factor becomes equal to the cosine of the desired conduction angle divided by two.

In yet a further preferred embodiment of the invention, the conduction angle is maintained substantially constant with variations in input signal amplitude.

A power amplifier in accordance with the present invention offers a significant improvement in that two previously mutually-exclusive features, namely high efficiency and substantially linear operation, can be achieved in a single circuit.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
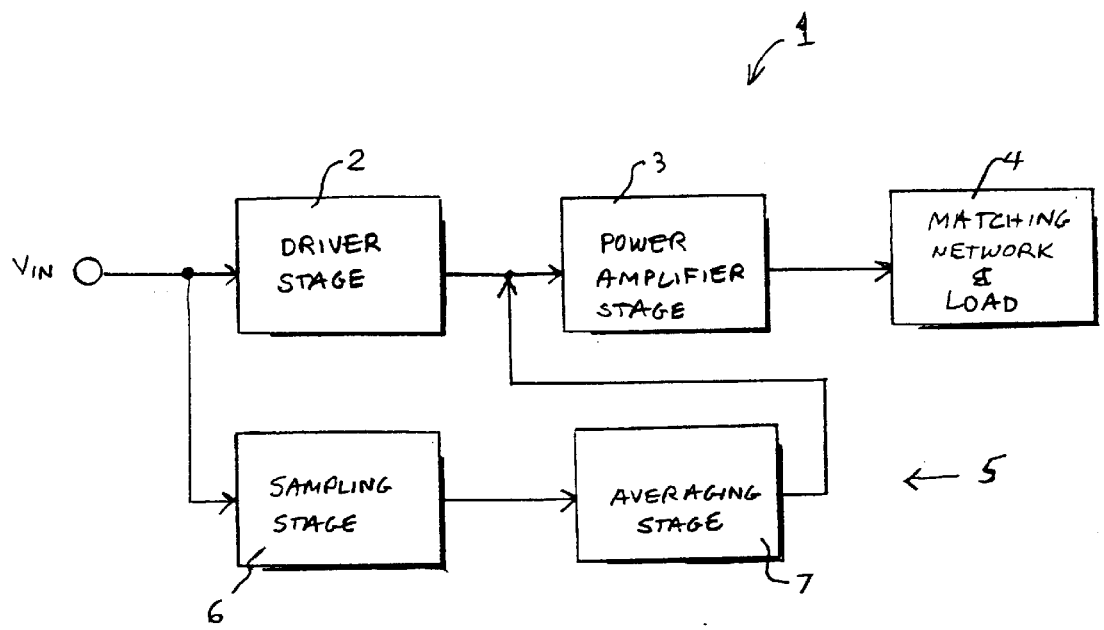
FIG. 1 shows a simplified block diagram of a power amplifier circuit in accordance with the invention.

A simplified block diagram of a power amplifier circuit 1 in accordance with the invention is shown in FIG. 1. The circuit includes a driver stage 2 having an input Vin and an output coupled to a power amplifier stage 3. The output of the power amplifier stage 3 is coupled to a matching network and load 4. In accordance with the invention, the circuit also includes a dc bias circuit 5 for biasing an amplifying transistor in the power amplifier stage to obtain the desired conduction angle of less than about 180°. The dc bias circuit includes a dynamic biasing circuit, described in further detail below, for decreasing a dc bias signal provided to the amplifying transistor as the input signal to input Vin increases. The dc bias circuit 5 is shown in simplified block form here as including a sampling stage 6 and an averaging stage 7, connected between Vin and the input to the power amplifier stage 3 containing the amplifying transistor.

Figure 2:
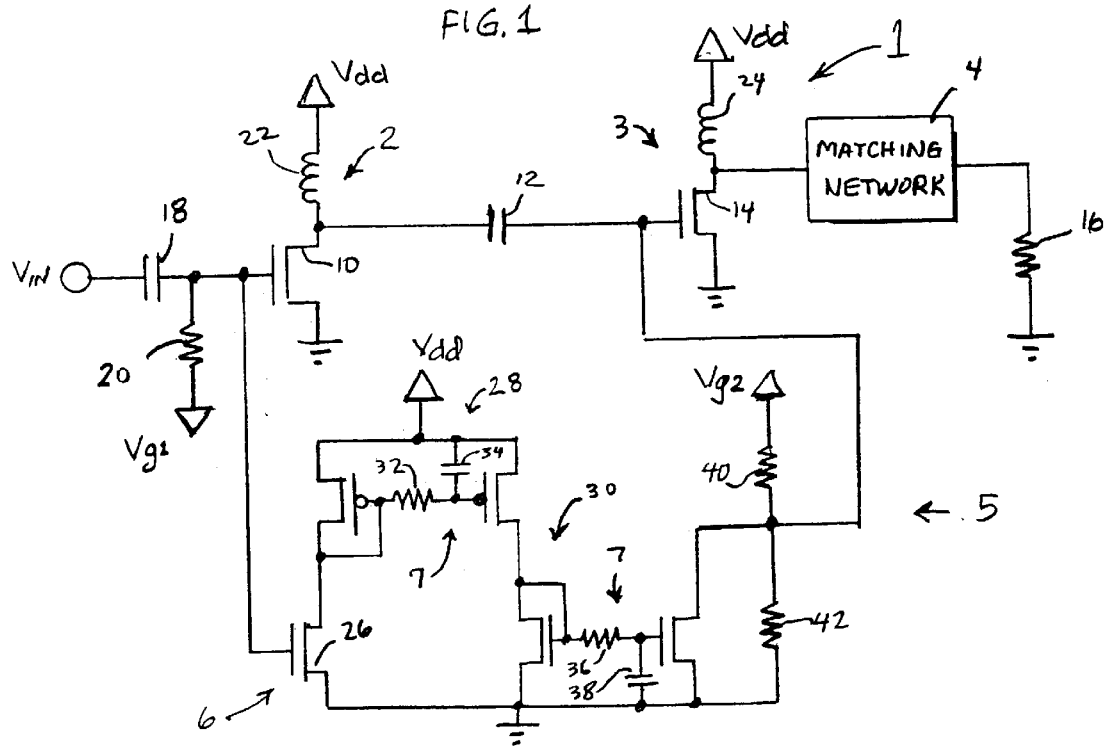
FIG. 2 shows a simplified schematic diagram of a power amplifier circuit in accordance with a preferred embodiment of the invention.

The power amplifier circuit 1 is shown in further detail in the simplified schematic diagram of FIG. 2. The basic amplifier includes a driver stage 2 including a driver transistor 10 and typically operated in Class B, capacitively coupled to power amplifier stage 3 by a capacitor 12. The power amplifier stage includes an amplifying transistor 14, operated in Class C and having an output coupled through matching network 4 to a load resistor 16. An input signal is applied at terminal Vin through a capacitor 18 to the input of transistor 10, and this transistor is biased from a bias supply Vg1 through a resistor 20. Transistors 10 and 14 are connected to a power supply Vdd through inductors 22 and 24, respectively.

The dc bias circuit 5 includes a sampling stage 6 having a transistor 26 with its input coupled to the input of transistor 10 and its output coupled to current mirror 28, which is in turn coupled to current mirror 30. Each of the current mirrors includes an RC filter (32,34 and 36,38, respectively) to form an averaging circuit for the averaging stage 7, and the output of current mirror 30 is coupled to a resistive divider comprised of resistors 40 and 42 connected in series between a bias supply Vg2 and ground. The output of the divider circuit is coupled to the input of transistor 14 to provide dynamic biasing of the amplifying transistor in a manner to be explained below.

Transistor 26 acts as a transconductance which generates a current proportional to the input voltage. Transistor 26 shares the bias voltage with transistor 10 assuming that transistor 10 is biased on Class B. If transistor 10 is not biased in Class B, then transistor 26 will be provided with its own resistive bias supply (biased in Class B) and will be capacitively connected to either $V_{in}$ or the drain of transistor 10.

In Class C amplifiers, the amplifying transistor has a conduction angle of less than about 180°. The drain (or collector in the case of a bipolar transistor) current has a waveform that follows the input for a portion of the cycle when the device is conducting and is zero when the device is cut off. In the prior art, the conduction angle depends not only on the bias level, but also on the input signal level, thus resulting in a nonlinear input-output relationship. This nonlinear relationship limits the applicability of the Class C amplifier, which would otherwise be more widely used since it offers the advantage of higher efficiency.

The present invention linearizes a Class C amplifier by providing a dynamic biasing circuit for decreasing the dc bias signal provided to the amplifying transistor as the input signal to the power amplifier circuit increases. In a preferred embodiment the amount of decrease is proportional to the amount of increase in the amplitude of the input signal, or, as discussed above, the cosine of the desired conduction angle divided by two. In this manner, the conduction angle is maintained substantially constant with variations in the input signal amplitude, and the amplifier will be linearized so as to perform in substantially the same manner as a Class B amplifier.

This linearization is accomplished in the circuit of FIG. 2 by using transistor 26 to sample the input signal, reflecting and averaging the sampled signal in the current mirrors and RC filters (28,30; 32,34 and 36,38) and then applying the current mirror 30 output to the resistive divider (40,42) to generate a bias signal at the input to amplifying transistor 14 which decreases as the input signal to the power amplifier circuit increases. Thus, for example, an increase in Vin will cause an increase in the averaged current flowing in the current mirrors, which will result in an increase in the current drawn out of the node connecting resistors 40 and 42. This, in turn, will cause an increase in the current flow through resistor 40 and a corresponding increase in the voltage drop across this resistor, thus lowering the voltage across resistor 42, which is the bias voltage applied to the input of transistor 14. In a similar manner, a decrease in Vin will result in an increase in the bias voltage applied to the input transistor 14.

In this manner, the present invention provides a power amplifier circuit capable of operating in the Class C mode to take advantage of the greater efficiency obtainable in this mode of operation, while at the same time providing a substantially linear input-output characteristic similar to that of a Class B amplifier.

While the invention has been particularly shown and described with reference to several preferred embodiments thereof, it will be understood by those skilled in the art that various changes in form and detail may be made without departing from the spirit or scope of the invention. Thus, for example, different types of transistors may be employed, and alterations to the circuit configuration may be made to suit particular design requirements.

What is claimed is:

1. A power amplifier circuit for amplifying an input signal and having a conduction angle of less than about 180°, said power amplifier circuit comprising an amplifying transistor and a dc bias circuit for biasing said amplifying transistor to obtain said conduction angle, said dc bias circuit comprising a dynamic biasing circuit for decreasing a dc bias signal provided to said amplifying transistor as the input signal to said power amplifier circuit increases.

2. A power amplifier circuit as in claim 1, wherein said power amplifier circuit is a linearized Class C amplifier circuit.

3. A power amplifier circuit as in claim 1, wherein the amount of decrease in the dc bias signal is proportional to the cosine of the desired conduction angle divided by two.

4. A power amplifier circuit as claimed in claim 1, wherein said dynamic biasing circuit comprises a sampling stage coupled to said input signal and at least one averaging stage having an input coupled to said sampling stage and an output coupled to an input of said amplifying transistor.

5. A power amplifier circuit as claimed in claim 1, wherein the amount of decrease in the dc bias signal is proportional to the amount of increase in the amplitude of the input signal.

6. A power amplifier circuit for amplifying an input signal and having a conduction angle of less than about 180°, said power amplifier circuit comprising an amplifying transistor and a dc bias circuit for biasing said amplifying transistor to obtain said conduction angle, said dc bias circuit having a sampling transistor, a first and second current mirror, and a resistive divider to generate a bias signal which decreases as the input to the power amplifier increases.

7. A power amplifier circuit for amplifying an input signal and having a conduction angle of less than about 180°, wherein the conduction angle is maintained substantially constant with amplitude variations in the input signal, said power amplifier circuit comprising an amplifying transistor and a dc bias circuit for biasing said amplifying transistor to obtain said conduction angle, said dc bias circuit having a dynamic biasing circuit for decreasing a dc bias signal provided to said amplifying transistor as the input signal to the power amplifier circuit increases.

* * * * *